(12) United States Patent
Kitaoka

(10) Patent No.: US 7,367,035 B2
(45) Date of Patent: Apr. 29, 2008

(54) DATA RECORDING DEVICE HAVING A PRESSING MECHANISM

(75) Inventor: Yasuhide Kitaoka, Saitama (JP)

(73) Assignee: Teac Corporation, Tokyo (JP)

( * ) Notice: Subject to any disclaimer, the term of this patent is extended or adjusted under 35 U.S.C. 154(b) by 551 days.

(21) Appl. No.: 10/830,971

(22) Filed: Apr. 23, 2004

(65) Prior Publication Data

US 2004/0223448 A1 Nov. 11, 2004

(30) Foreign Application Priority Data

Apr. 25, 2003 (JP) ............................. 2003-122199

(51) Int. Cl.
  *G11B 17/03* (2006.01)
  *G11B 17/08* (2006.01)
(52) U.S. Cl. .................... 720/630; 360/98.06
(58) Field of Classification Search ...................... None
  See application file for complete search history.

(56) References Cited

U.S. PATENT DOCUMENTS 6,058,011 A * 5/2000 Hardt et al. ................. 361/694
D454,854 S * 3/2002 Yamashita et al. ......... D14/167
6,529,374 B2 3/2003 Yamashita et al. .......... 361/687

* cited by examiner

*Primary Examiner*—David Davis
(74) *Attorney, Agent, or Firm*—Weingarten, Schurgin, Gagnebin & Lebovici LLP

(57) ABSTRACT

A data recording device to and from which a memory cartridge accommodating memory cards that are data recording media can be attached and detached is provided. According to the data recording device, it is possible to firmly connect the memory cards loaded in the memory slot to connectors and to thus improve stability against vibration. In the data recording device A to and from which the memory cartridge B accommodating the memory cards DM that are the data recording media can be attached and detached, the opening and closing door 2 is provided in the accommodating portion of the memory cartridge B of the data recording device A. A pressing mechanism for elastically supporting the memory cards CM loaded in the memory slot in the direction where the memory cards CM are loaded is provided in the opening and closing door 2.

5 Claims, 13 Drawing Sheets

DATA RECORDING DEVICE HAVING A PRESSING MECHANISM

This application claims priority to a Japanese application No. 2003-122199 filed Apr. 25, 2003.

BACKGROUND OF THE INVENTION

1. Field of the Invention

The present invention relates to a data recording device that accommodates memory cards that are data recording media to thus constitute a memory cartridge and is loaded with and integrated with the memory cartridge, the data recording device for recording image information generated as digital signals in the memory cards of the memory cartridge.

2. Description of the Related Art

Data recording devices using magnetic tapes as data recording media have been developed as flight recorders (Airborne Video Tape Recorders (AVTR)) mounted in airplanes. However, since higher reliability is requested, memory cards (PCMCIA cards) that adopt semiconductor memory elements are being used. In order to solve problems caused by the generation of heat inside the sealed case of the data recording device, to and from which a memory cartridge as a single substance composed of a plurality of accommodated memory cards can be attached and detached, the applicant of the present application tries to take measures (for example, Patent Document 1).

[Patent Document 1]

U.S. Pat. No. 6,529,374 B2

The patent document 1 discloses a widely used improved technology capable of solving problems caused by the generation of heat in an electronic apparatus whose case is sealed. The technology is essential to the data recording device according to the present invention. However, although basic problems such as the generation of heat were solved, problems such as convenience of use or safety measures for protecting data remain as objects to be solved.

That is, for example, in the case of the structure disclosed in the conventional patent document 1, when the memory cartridge is mounted in a main body, since the entire memory cartridge is connected to a connector while being buried in the main body, it is difficult to take the memory cartridge out. Since the memory cartridge is not forcibly supported in a state where the data recording device is driven, the memory cartridge may be disconnected from the connector or the connection state may deteriorate, due to vibration. Since the data recording device according to the present invention has the function of a computer, when the memory cartridge is taken out from the main body, in order to protect the data recorded in the memory cards of the memory cartridge, it is necessary to take the safety measures of taking the memory cartridge out after shutting down the computer.

SUMMARY OF THE INVENTION

Therefore, in order to solve the problems of the data recording device to and from which the memory cartridge can be attached and detached, it is an object of the present invention to provide a memory recording device in which the memory cards loaded in memory slots can be firmly connected to the connector so as not to be easily disconnected from the connector due to vibration.

To achieve this object, in the invention according to claim 1, there is provided a data recording device replaceably equipped with a memory cartridge accommodating a memory card as a data recording medium. An open-close door is provided in an accommodating portion for the memory cartridge. A pressing mechanism for elastically supporting the memory cards loaded in the memory slot in the direction where the memory card is loaded is provided in the open-close door.

In the invention according to claim 2, the pressing mechanism comprises a seesaw lever which operates when the open-close door is closed.

In the invention according to claim 3, when the open-close door is closed, the pressing mechanism operates so as to manipulate a door knob.

DESCRIPTION OF THE PREFERRED EMBODIMENT

Hereinafter, preferred embodiments of the present invention will be described in detail with reference to the accompanying drawings. In addition, since the present invention is completed by compounding a plurality of components, in order to facilitate appreciation thereof, the entire structure will be schematically described.

Figure 1:
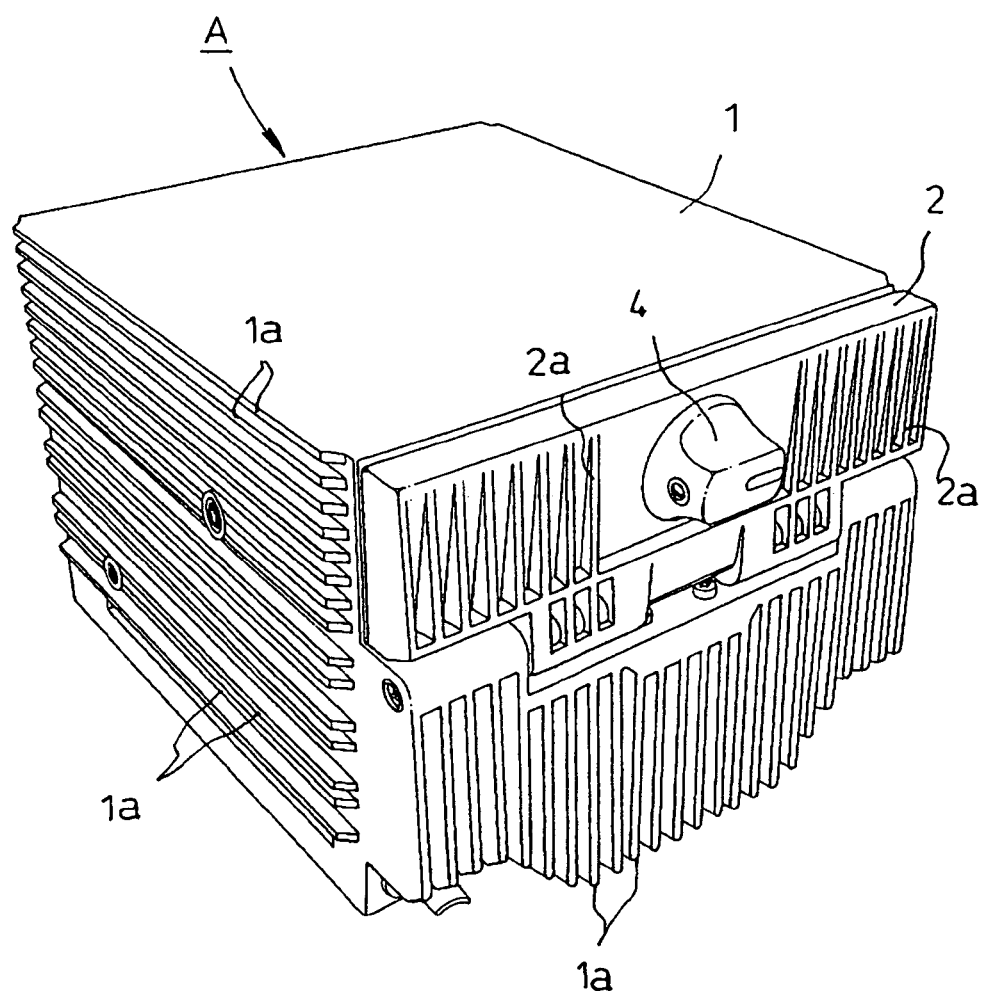
FIG. 1 is a perspective view illustrating the external appearance of a state in which a data recording device according to the present invention is completed.
Figure 2:
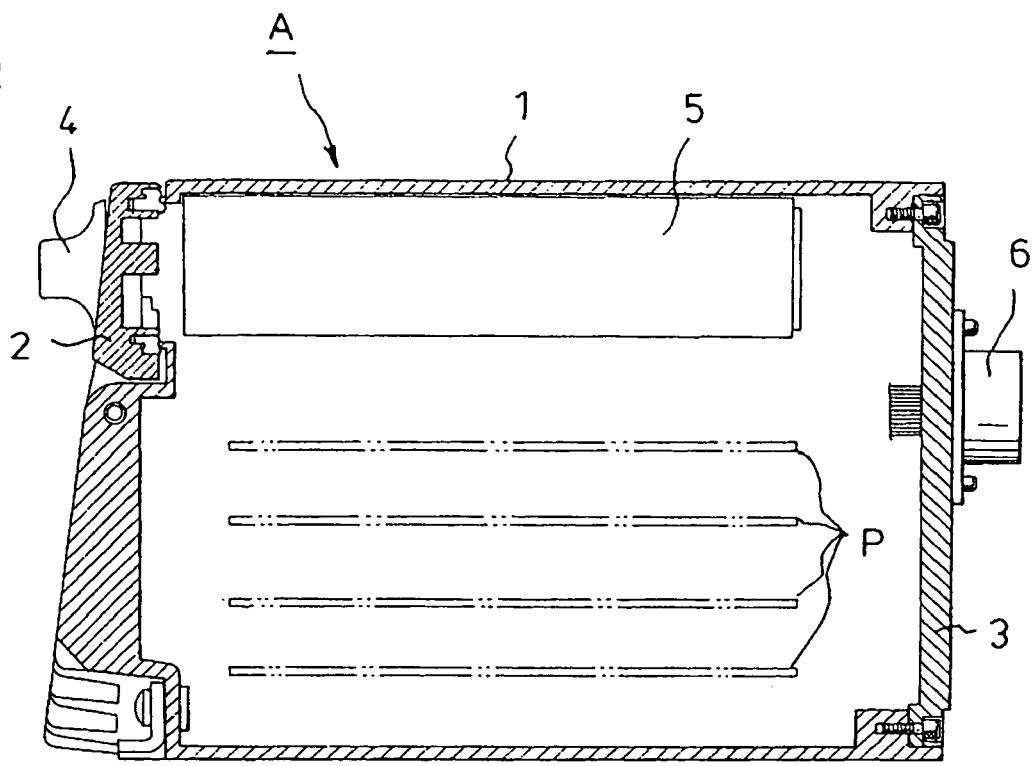
FIG. 2 is a sectional view illustrating the internal structure of FIG. 1.

FIG. 1 is a perspective view illustrating a state in which a data recording device A according to the present invention is completed. The present invention is mainly composed of the data recording device A and a memory cartridge B illustrated in FIG. 3, which can be attached to and detached from the data recording device A. The main body 1 of the data recording device A is integrally molded by aluminum die casting so that only the parts in which an opening and closing door 2 and a rear surface panel 3 are provided on the upper portion of the front surface are opened as illustrated in FIG. 2. As noted from FIG. 2, when the opening and closing door 2 and the rear surface panel 3 are mounted, the inside of the case of the data recording device A is sealed so that the heat generated from electronic parts is accumulated. Therefore, in order to radiate the generated heat inside the case of the data recording device A, radiation fins 1a and 2a are formed in the side and in the lower portion of the front surface of the main body 1 and in the front surface of the opening and closing door 2.

A door knob 4 is provided in the center of the opening and closing door 2. The manipulation of the door knob 4 is transmitted to the rear surface of the opening and closing door 2 by a knob rod 4a. FIG. 2 schematically illustrates the internal structure of the main body 1. A memory cartridge holder 5 for accommodating the memory cartridge B is provided in the hind portion of the opening and closing door 2. In addition, a plurality of substrate boards P, on which electronic parts for constituting electronic circuit components such as an input and output interface and a computer are mounted, are provided in the lower portion of the memory cartridge holder 5. In addition, a rear surface panel 3 molded by the aluminum die casting is provided in the aperture of the rear surface of the main body 1. A connector 6 for external wiring lines is provided in the rear surface panel 3.

Figure 4:
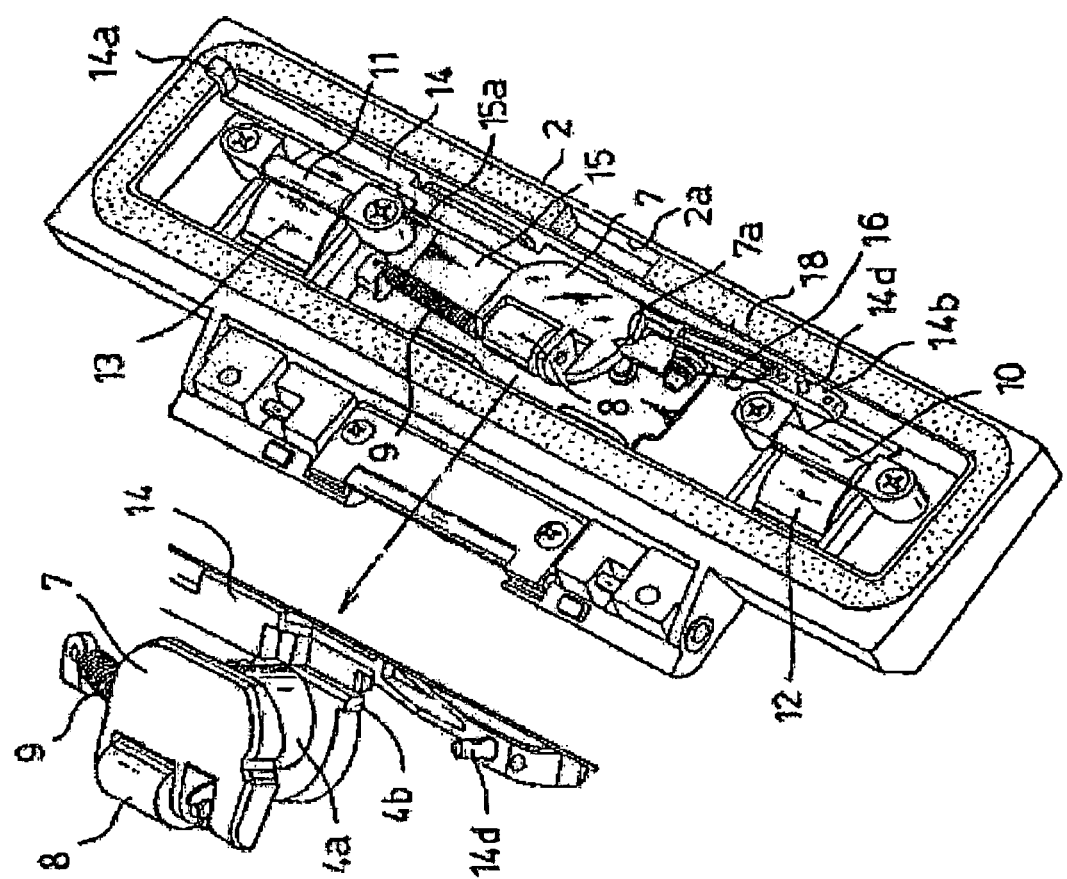
FIG. 4 is a perspective view illustrating the structure of an opening and closing door.

FIG. 4 illustrates the structure of the rear surface of the opening and closing door 2. A latch plate 7 for latching the opening and closing door 2 to the main body 1 is fixed to the end of the backside of the knob rod 4a for fixing the door knob 4. A pressing roller 8 is rotatably mounted in the end of the latch plate 7. A locking groove 7a locked to the following latch mechanism is formed in the side of the latch plate 7. In addition, the knob rod , 4a of the latch plate 7 is elastically supported by a tension coil spring 9 in the direction where the opening and closing door 2 is opened from the main body 1. When the opening and closing door 2 is opened, as illustrated in FIG. 4, the right position of the knob rod 4a is maintained. Pressing rollers 10 and 11 that are elastically supported by plate springs 12 and 13 are rotatably provided on both sides of the backside of the opening and closing door 2. As mentioned later, the loaded memory cartridge B is pressed by the pressing rollers 10 and 11.

Figure 5:
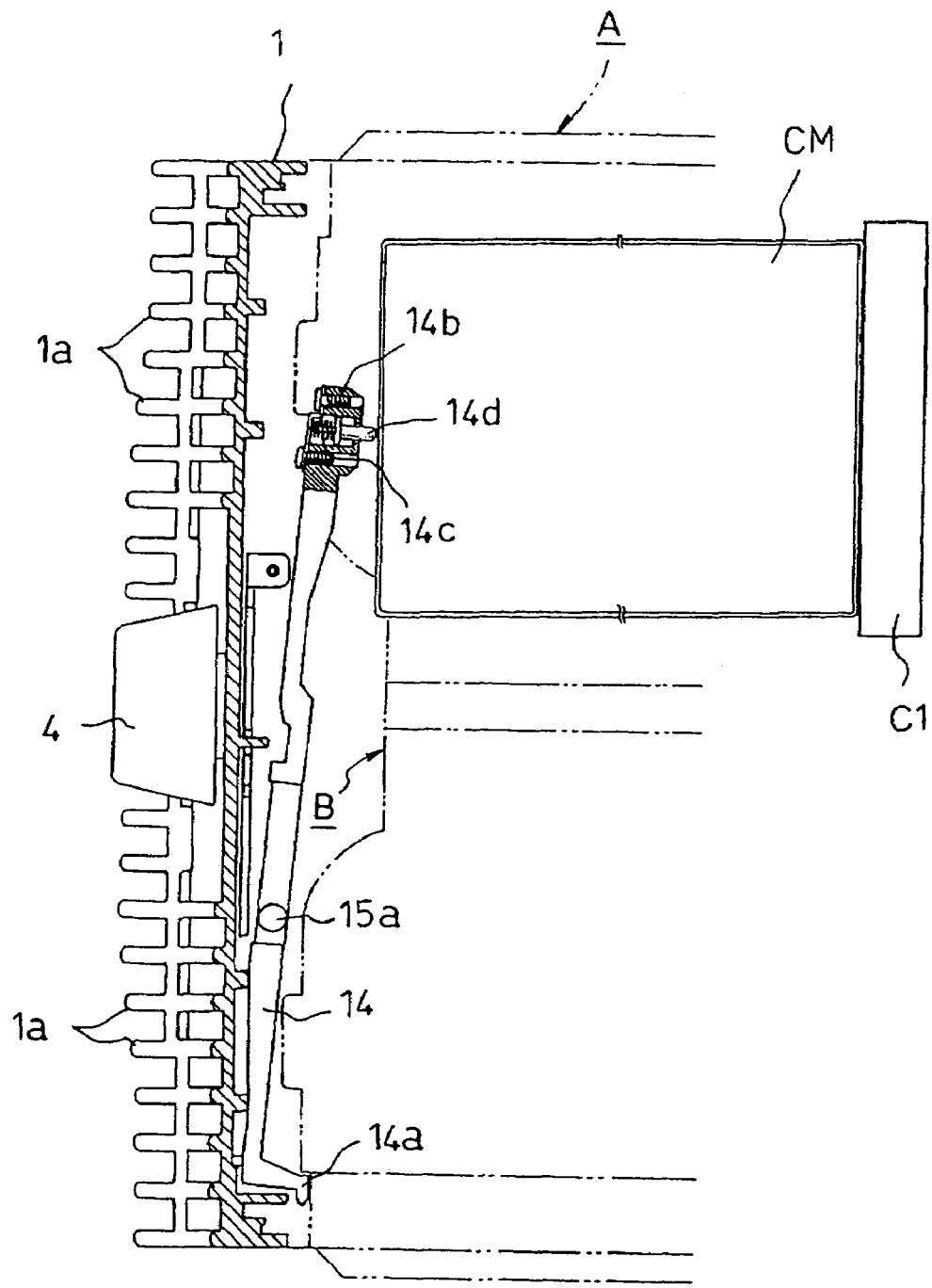
FIG. 5 is a view illustrating a state in which a memory card is fixed.

Reference numeral 14 denotes a seesaw lever pivoted 15a to the upstanding piece of a base plate 15 fixed to the bottom surface of the opening and closing door 2 so as to fluctuate. When the opening and closing door 2 is closed to the main body 1 as illustrated in FIG. 5, in the seesaw lever 14, a manipulation end 14a is pressed on the sidewall of the main body 1 and an operation end 14b fluctuates so that the rear end of the memory card CM that stores the later-mentioned system control program is pressed by a pressing pin 14d elastically supported by a compression coil spring 14c built in the front end of the seesaw lever 14 to thus prevent the memory card CM from being detached from a multi-connector C1. When the opening and closing door 2 is opened from the main body 1, the seesaw lever 14 is returned to the right position by the operation of a twist coil spring 16 so that the protrusion 4b of the knob rod 4a contact the seesaw lever 14 as illustrated in FIG. 4. Therefore, the rotation of the knob rod 4a is prevented so that the door knob 4 does not unnecessarily rotate.

The opening and closing door 2 having the above structure is fixed to the main body 1 by a hinge mechanism 17. However, when the opening and closing door 2 is opened from the main body 1, it is possible to prevent the opening and closing door 2 from fluctuating of itself and to thus fix the opening and closing door 2 to the right position by using a toggle spring structure for the hinge mechanism 17. In addition, concave grooves 2a are formed in the outer circumference of the inside of the opening and closing door 2. A packing 18 made of a material having air tightness and water tightness and:preventing a static electricity and electronic waves from entering is buried in the concave grooves 2a.

Reference numeral 14 denotes a seesaw lever pivoted 15a to the upstanding piece of a base plate 15 fixed to the bottom surface of the opening and closing door 2 so as to fluctuate. When the opening and closing door 2 is latched to the main body 1 as illustrated in FIG. 5, in the seesaw lever 14, a manipulation end 14a is pressed on the sidewall of the main body 1 and an operation end 14b fluctuates so that the rear end of the memory card CM that stores the later-mentioned system control program is pressed by a pressing pin 14d elastically supported by a compression coil spring 14c built in the front end of the seesaw lever 14 to thus prevent the memory card CM from being detached from a multi-connector C1. When the opening and closing door 2 is unlatched from the main body 1, the seesaw lever 14 is returned to the right position by the operation of a twist coil spring 16 so that the protrusion 4b of the knob rod 4a contact the seesaw lever 14 as illustrated in FIG. 4. Therefore, the rotation of the knob rod 4a is prevented so that the door knob 4 does not unnecessarily rotate.

The opening and closing door 2 having the above structure is fixed to the main body 1 by a hinge mechanism 17. However, when the opening and closing door 2 is unlatched from the main body 1, it is possible to prevent the opening and closing door 2 from fluctuating of itself and to thus fix the opening and closing door 2 to the right position by using a toggle spring structure for the hinge mechanism 17. In addition, concave grooves 2a are formed in the outer circumference of the inside of the opening and closing door 2. A packing 18 made of a material having air tightness and water tightness and preventing a static electricity and electronic waves from entering is buried in the concave grooves 2a.

Figure 6:
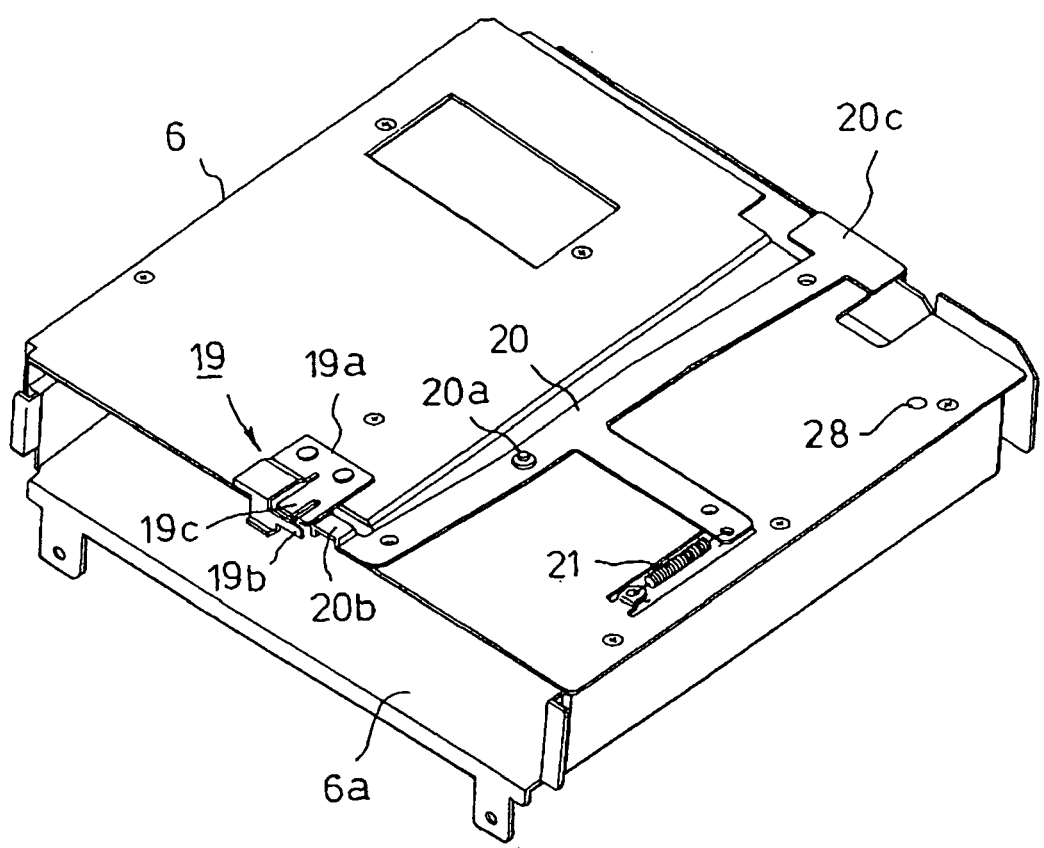
FIG. 6 is a perspective view illustrating the structure of a memory cartridge holder.
Figure 7:
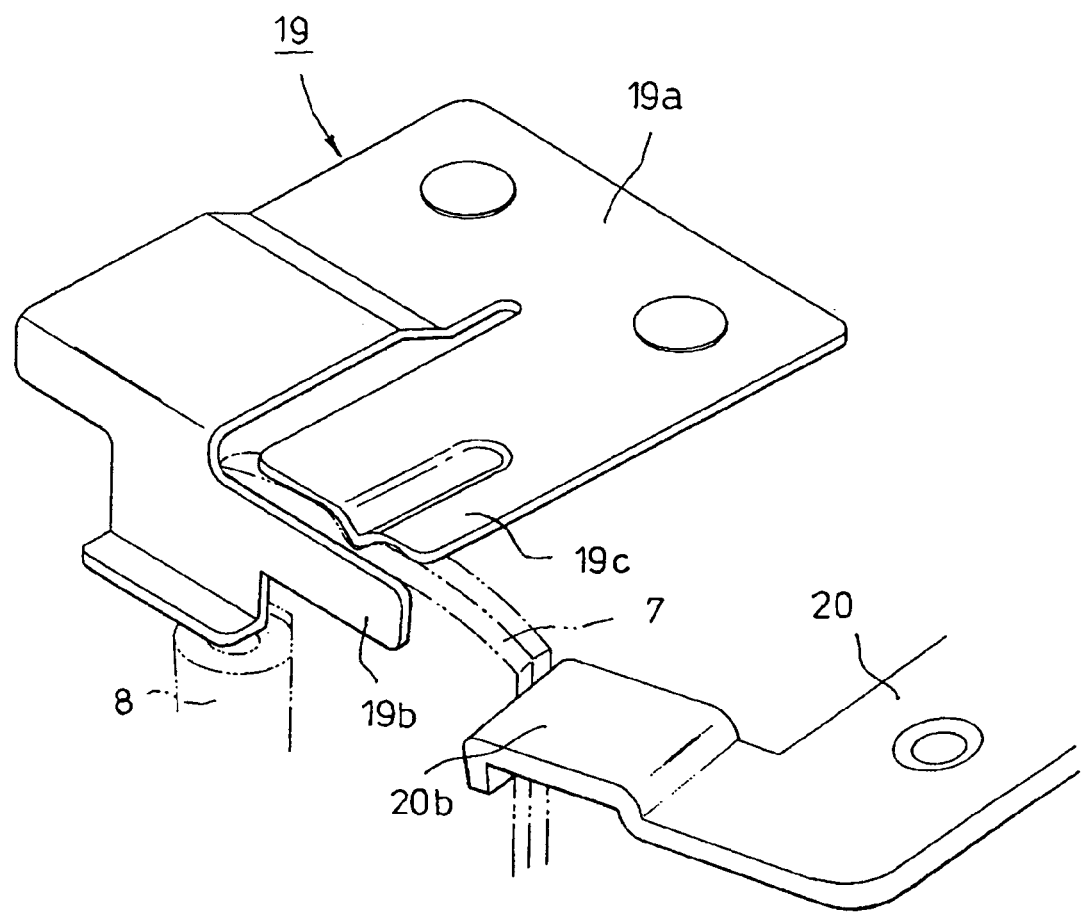
FIG. 7 is a perspective view illustrating a mechanism for latching the opening and closing door.

FIG. 6 is a perspective view illustrating the external appearance of the memory cartridge holder 5 for accommodating the memory cartridge B. An aperture 6a is formed in the front end and a latch mechanism 19 is provided in the center of the top plate that contacts the aperture 6a. As illustrated in FIG. 7, the latch mechanism 19 is formed by bending one plate spring. A main body 19a is fixed to the top plate of the memory cartridge holder 5 by appropriate means such as welding. An elastic piece 19b and a locking piece 19c are formed in the free end of the plate spring. Therefore, when the door knob 4 is rotated in order to latch the opening and closing door 2 to the main body 1, the latch plate 7 slidably contacts the elastic piece 19b so that the opening and closing door stops in the right position by sliding contact friction greater than the tension of the tension coil spring 9. The locking piece 19c is formed to generate a click sense by locking the protrusion thereof to the locking groove 7a of the latch plate 7 so that the door knob 4 is correctly manipulated.

On the other hand, a switch lever 20 elastically supported by a tension coil spring 21 is provided in the top plate of the memory cartridge holder 5 so as to fluctuate around a support point 20a. Therefore, as illustrated in FIG. 7, when the latch plate 7 approaches the latch mechanism 19, the side end of the latch plate 7 presses the front end 20b of the switch lever 20. Therefore, a rear end 20c fluctuates to thus operate the switch provided in the rear surface of the memory cartridge holder 5. Therefore, an electric signal for sensing that the opening and closing door 2 is latched to the main body 1 is obtained and is transmitted to a control circuit.

Figure 3:
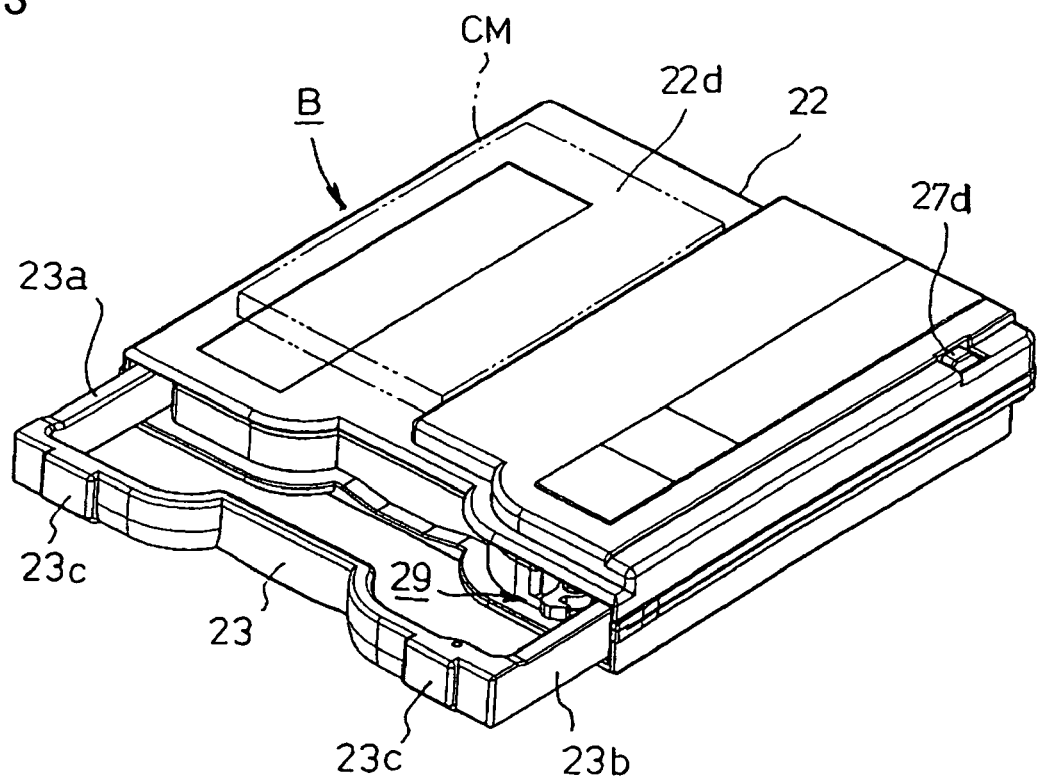
FIG. 3 is a perspective view illustrating the external appearance of a memory cartridge according to the present invention.
Figure 8:
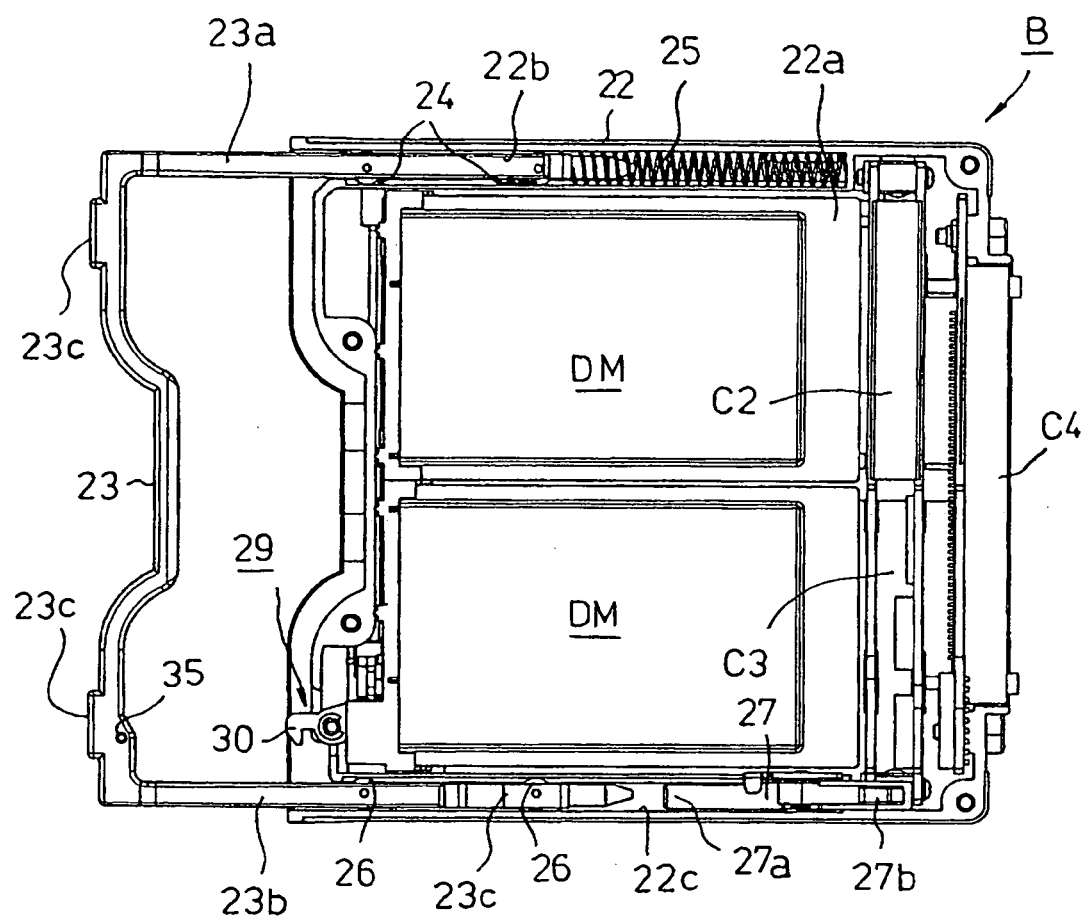
FIG. 8 is a view illustrating the internal structure of the memory cartridge.

The memory cartridge B to be loaded in the main body 1 has the external appearance illustrated in FIG. 3. A case-shaped main body 22 is molded by the aluminum die casting. In order to accommodate the plurality of memory cards DM using semiconductor memory elements as data recording media, as illustrated in FIG. 8, a hollow portion 22*a* is formed in the main body 22. The number of memory cards DM varies in accordance with the setting of the entire memory capacity. However, according to the present embodiment, seven memory cards can be accommodated. When the memory capacity of one memory card is 1.2 GB (gigabyte), the entire memory capacity is 8.4 GB by a simple calculation. In addition, the memory cards DM are connected to multi-connectors C2 and C3 and can be connected to the data recording device A by a multi-connector C4.

Therefore, as illustrated in FIG. 8, when the memory cards DM are arranged in parallel in the main body 22, the number of memory cards DM accommodated in one direction is smaller than the number of memory cards DM accommodated in the other direction by one. Therefore, in the memory cartridge B according to the present invention, the top plate in the portion where a smaller number of memory cards DM are accommodated is molded to become a top plate 22*d* lower by one stage. A space on the formed top plate 22*d* is used as a memory slot so as to accommodate the above-mentioned memory cards CM. Therefore, the memory cards DM accommodated in the main body 22 are exclusively used for recording data and the system control program is stored in the memory cards CM. As mentioned above, step difference is formed in the top plate of the memory cartridge B so that the memory cartridge B is unsymmetrical in the right and left directions. Therefore, it is possible to prevent the memory cartridge B from being loaded in the data recording device A in a wrong direction. Also, the memory cards CM and the memory cards DM in which semiconductor memory elements are used as memory elements are commonly distributed. However, since it is possible to use memory cards in which hard disks are used as the memory elements, the subject of the present invention is not changed even if any memory cards are used.

It is possible to take out the memory cartridge B from the data recording device A by forming the memory cartridge B to be exclusively used for recording. The contents of the memory cards DM of the memory cartridge B having portability can be read by an editing device provided in another space and can be erased. On the other hand, since the memory cards CM can be taken out from and put in the multi-connector C1 as illustrated in FIG. 5, it is possible to take out only the memory cards CM from it so that an updated and changed system control program can be recorded in the memory cards CM.

In order to realize the above aspect, to improve the manipulation and the convenience of use, and to secure the safety of the system, the memory cartridge B according to the present invention has the later-mentioned characteristic structure. First, since the memory cartridge B can be attached to and detached from the data recording device A, in particular, in order to facilitate the manipulation when the memory cartridge B is taken out from the data recording device A, a handle 23 is mounted in the main body 22 so that the memory cartridge B is taken out by gripping the handle 23.

The handle 23 includes pressure receiving portions 23*c* on both sides of the front end thereof and is U-shaped as illustrated in FIG. 8. A supporting roller 24 is provided in a supporting beam 23*a* in one direction so that the supporting beam 23*a* can proceed and recede in a guide groove 22*b* formed on the side of the main body 22. The handle 23 is elastically supported by the compression coil spring 25 to thus always protrude outside the main body 22.

Figure 9:
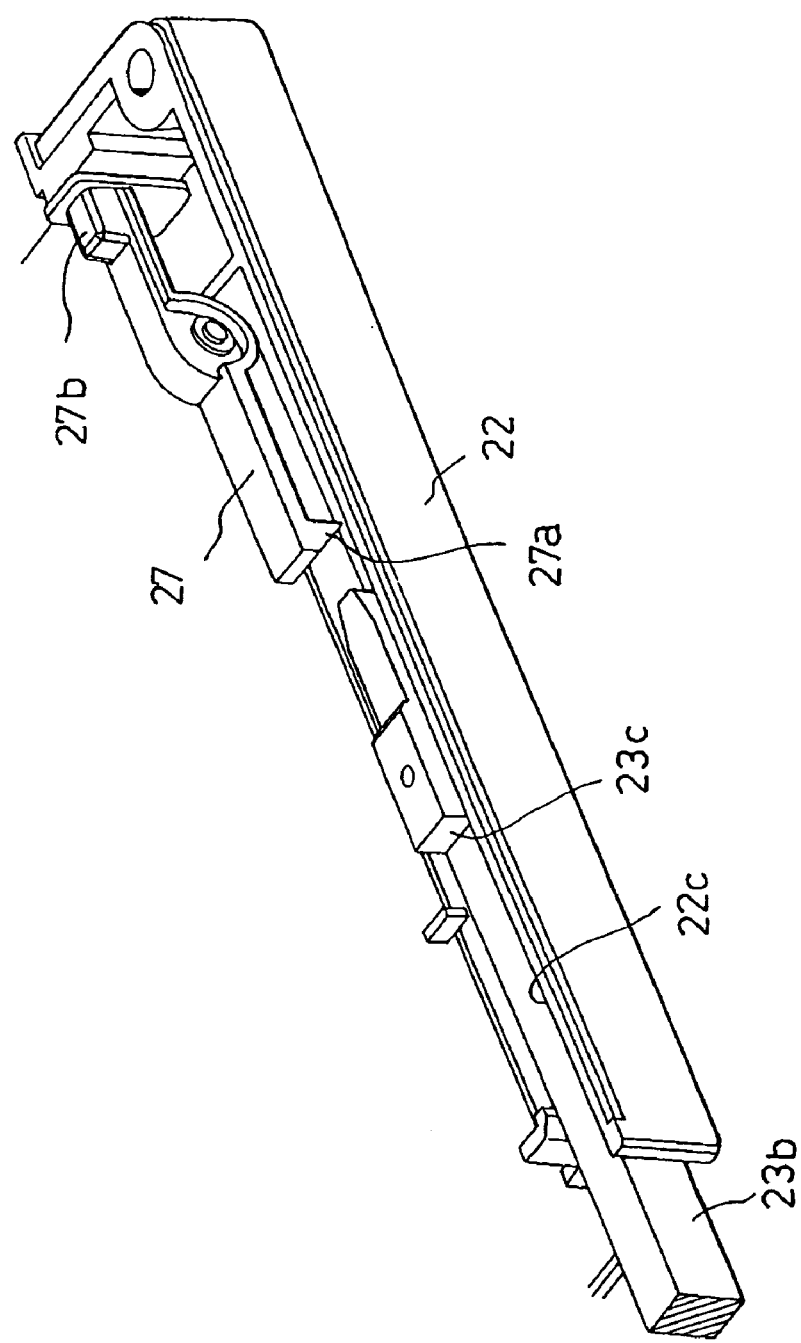
FIG. 9 is a view illustrating the operation of the handle of the memory cartridge.

On the other hand, a supporting beam 23*b* includes a supporting roller 26 to thus proceed and recede in a guide groove 22*c* formed on the side of the main body 22. As illustrated in FIG. 9, a protruding end 23*c* is formed in the front end of the supporting beam 23*b*. A locking member 27 in which a hook 27*a* hooked to the protruding end 23*c* is formed is arranged inside the guide groove 22*c*. The hook 27*a* in the front end of the locking member 27 is always elastically supported to thus fall in the guide groove 22*c*. A pressure receiving end 27*b* that receives the pressure for fluctuating the locking member 27 is formed in the rear end of the locking member 27.

Figure 10:
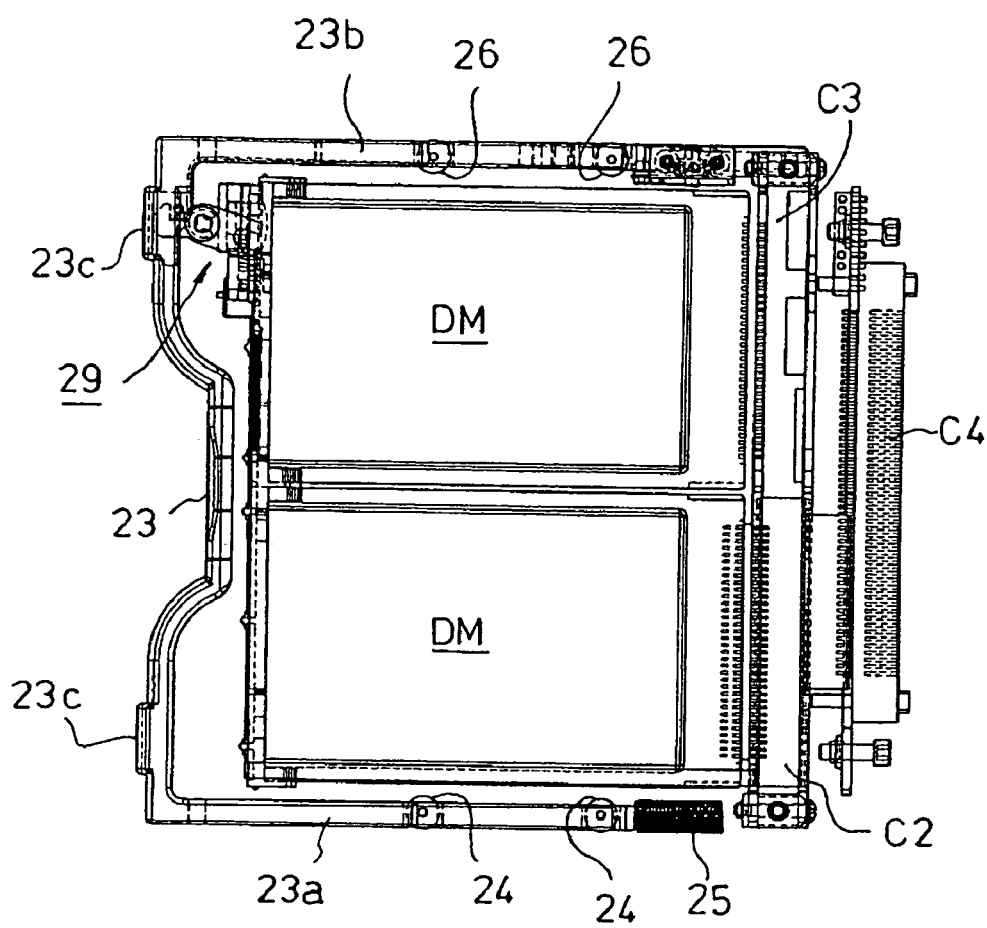
FIG. 10 is a view illustrating a state in which the handle operates.

Since the supporting beam 23*b* has the above-mentioned structure, when the handle 23 proceeds in the state of FIG. 8, since the protruding end 23*c* is hooked to the hook 27*a* of the locking member 27, as illustrated in FIG. 10, it is possible to accommodate the handle 23 in the main body 22 and to thus fix the handle 23 to the main body 22. In addition, when the memory cartridge B is loaded in the data recording device A, a pressing pin 28 (refer to FIG. 6) suspended from the top plate of the memory cartridge holder 5 in the position where the memory cartridge B is loaded in the data recording device A presses the pressure receiving end 27*b* that contacts the top plate of the main body 22 as illustrated in FIG. 3. Therefore, the protruding end 23*c* is unlocked from the hook 27*a*. The detailed contents of such a function will now be described.

Next, an eject/lock mechanism 29 for accommodating the handle 23 in the main body 22 so that the handle 23 is fixed to the main body 22 (lock) and for popping out the handle 23 from the main body 22 after being unlocked (eject) will now be described.

Figure 11:
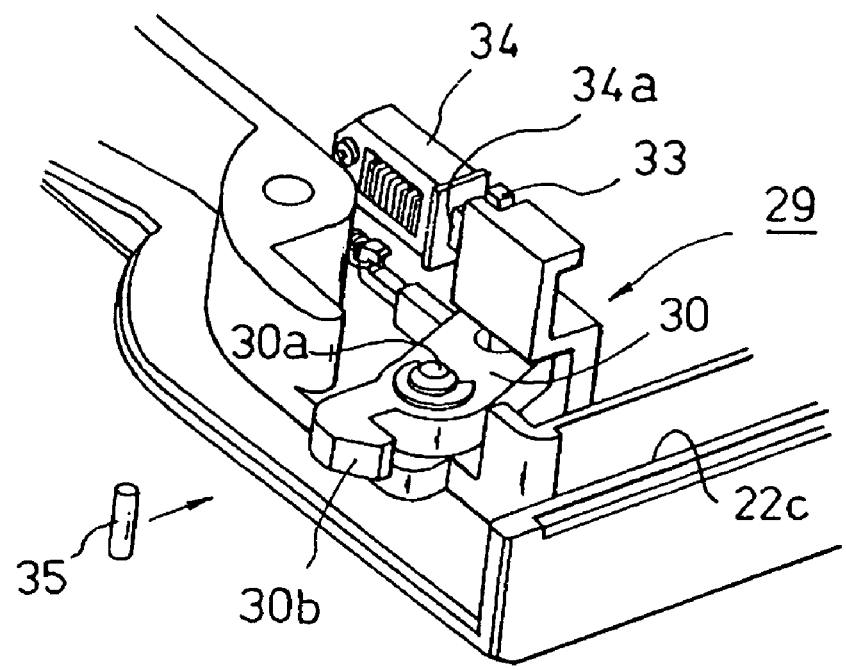
FIG. 11 is a perspective view illustrating an eject/lock mechanism.
Figure 11:
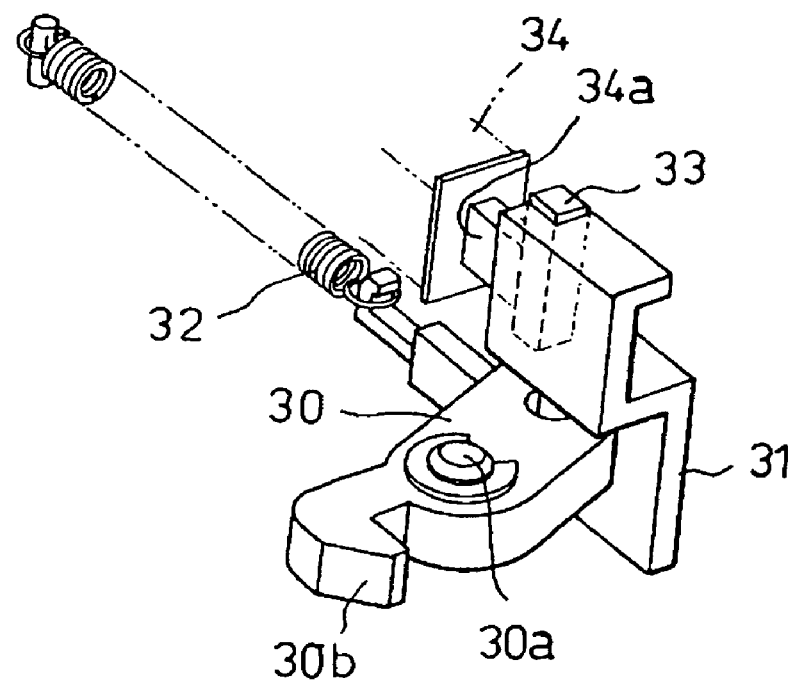

The eject/lock mechanism 29 is provided on the side of the front end of the aperture of the memory cartridge B as illustrated in FIG. 3. The concrete structure thereof will be illustrated in FIG. 11. In FIG. 11, reference numeral 30 denotes a lock lever that is pivoted by a sliding member 31 to thus fluctuate, so that a hook 30*b* in the front end of the lock lever 30 fluctuates around a support point 30*a* in accordance with the reciprocating motion of the sliding member 31. In addition, the sliding member 31 is elastically supported by the tension coil spring 32 having tension weaker than the tension of the compression coil spring 25 of the above-mentioned supporting beam 23*a* to thus maintain the lock lever 30 in the right position. In addition, a magnetic body 33 is fixed to the sliding member 31. A solenoid 34 for sucking the magnetism of the magnetic body 33 by a yoke 34*a* is fixed to the main body 22. In addition, the magnetism sucking force of the solenoid 34 is set to be stronger than the tension of the compression coil spring 25.

Since the eject/lock mechanism 29 has the above structure, when the memory cartridge B is loaded in the data recording device A, the locking of the handle 23 is performed by hooking a locking pin 35 included in the handle to the hook 30*b* of the lock lever 30. When the handle 23 is accommodated in the main body 22 so that the handle 23 is fixed to the main body 22 in a state where the memory cartridge B is taken out from the data recording device A so that the memory cartridge B becomes a single substance, as mentioned above, the locking of the handle 23 is performed by hooking the protruding end 23*c* of the supporting beam 23b to the hook 27a of the locking member 27 to thus improve the portability of the eject/lock mechanism 29.

Figure 12:
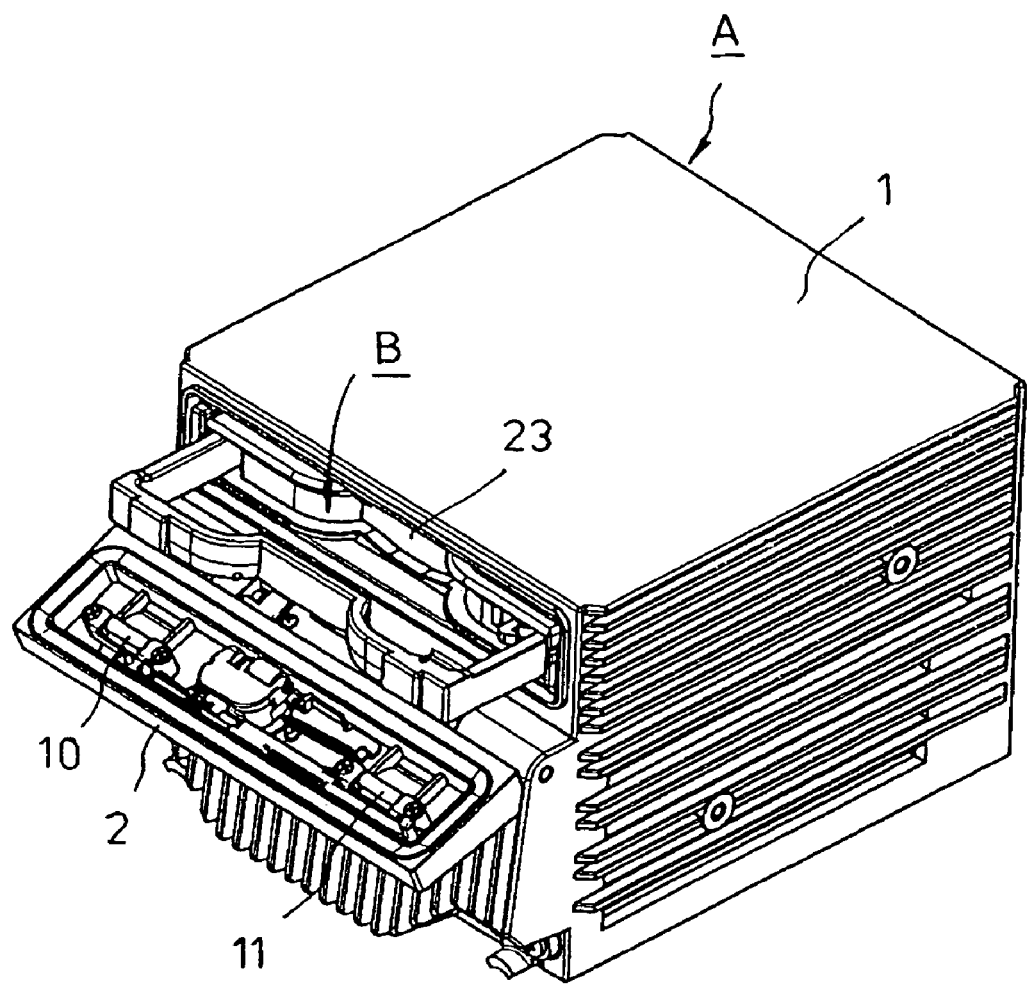
FIG. 12 is a perspective view illustrating a state in which the memory cartridge is loaded.

Next, the operation state of the eject/lock mechanism 29 when the memory cartridge B is loaded in the data recording device A will now be described. When the memory cartridge B is loaded in the data recording device A, as illustrated in FIG. 12, the handle 23 is popped out. According to the state illustrated in FIG. 12, since the main body 22 of the memory cartridge B is in the position where the memory cartridge B is loaded in the data recording device A, as mentioned above, the pressing pin 28 suspended from the top plate of the memory cartridge holder 5 presses the pressure receiving end 27b of the locking member 27 and the protruding end 23c is unhooked from the hook 27a so that the handle 23 is popped out by the operation of the compression coil spring 25.

Figure 13:
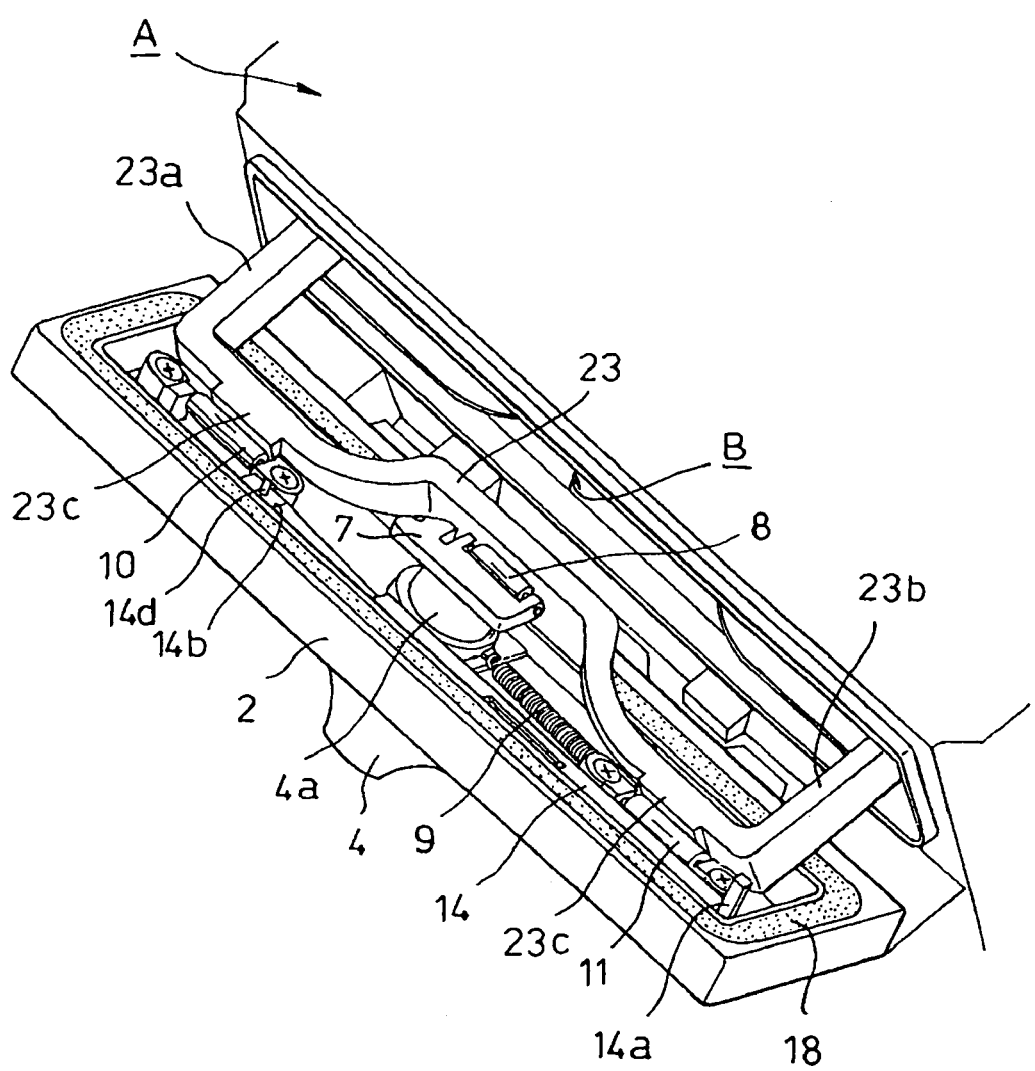
FIG. 13 is a perspective view illustrating a state in which the opening and closing door operates.

When the opening and closing door 2 is rotated in the closing direction in this state, as illustrated in FIG. 13, the pressing roller 8 of the latch plate 7 presses the center of the handle 23 so that the handle 23 begins to recede. When the recession of the handle 23 proceeds, the pressure receiving portions 23c on both sides of the front end of the handle 23 are pressed by the pressing rollers 10 and 11 arranged on both sides of the back side of the opening and closing door 2. When the handle 23 reaches the position in which the opening and closing door 2 is completed latched, the multi-connector C4 in the rear end of the memory cartridge B is connected to the multi-connector of the data recording device A by the final pressure of the pressing rollers 10 and 11.

At this time, the pressing roller 8 of the latch plate 7 is disconnected from the end of the handle 23. At the same time, the manipulation end 14a of the seesaw lever 14 fluctuates in a state of being connected to the sidewall of the main body 1 so that the door knob 4 is rotatable. On the other hand, the pressing pin 14d in the front end of the fluctuated seesaw lever 14 presses the rear end of the memory cards CM loaded in the top plate of the memory cartridge holder 5 to thus prevent the memory cards CM from being detached from the multi-connector C1. In this state, since the pressing rollers 10 and 11 are elastically supported by the plate springs 12 and 13, the memory cartridge B is always pressed in the direction where the memory cards CM are loaded to thus firmly connect the memory cards DM to the multi-connectors C2 and C3. By doing so, when the handle 23 is completely accommodated in the main body 1, the locking pin 35 of the handle 23 is hooked to the hook 30b of the lock lever 30.

In this state, when the door knob 4 is rotated, the latch plate 7 is latched as illustrated in FIG. 7 so that the opening and closing door 2 is completely closed to the main body 1. At this time, since the switch lever 20 provided in the top plate of the memory cartridge holder 5 fluctuates, a switch operates in the rear end 20c thereof. When sensing that the memory cartridge B is loaded by the electric signal, the solenoid 34 starts to be supplied with electricity so that the locking state is maintained by the eject/lock mechanism 29.

Then, the operation state when the memory cartridge B is taken out from the data recording device A will now be described. As mentioned above, according to the present invention, since the semiconductor memory elements are used as the data recording media, a computer is mounted in the main body 1 of the data recording device A so that data is recorded by controlling the computer. Therefore, when the memory cartridge B is taken out from the data recording device A, it is necessary to completely shut down the electronic circuits such as the computer in the main body 1.

If the memory cartridge B is taken out during the operation of the electronic circuits such as the computer, the data stored in the memory cartridge B may be damaged. Therefore, according to the present invention, the following safety measures are taken.

Figure 14:
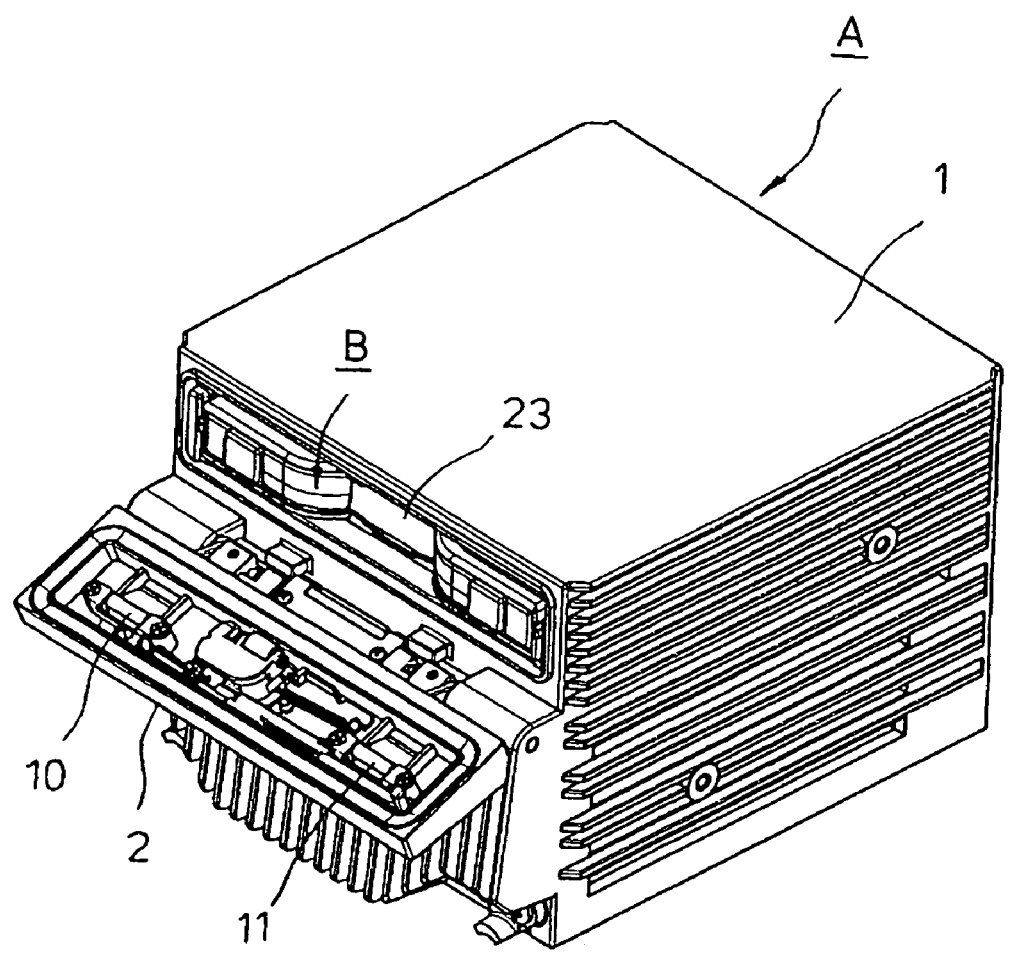
FIG. 14 is a perspective view illustrating a state in which the handle is locked.

That is, in order to take out the memory cartridge B from the data recording device A, from right after the opening and closing door 2 is opened to until the electronic circuits are shut down, as illustrated in FIG. 14, the handle 23 is not popped out. When the door knob 4 is rotated in order to open the opening and closing door 2, the switch lever 20 is returned to the original position, the switch operates again in the rear end 20c thereof, and the electric signal for sensing that the opening and closing door 2 is opened is transmitted. Therefore, the electronic circuits start to be shut down. However, at this point of time, the solenoid 34 of the memory cartridge B remains supplied with electricity. Therefore, the eject/lock mechanism 29 remains locked and the handle 23 is not popped out even if the opening and closing door 2 is opened.

When the electronic circuits are completely shut down, the supplying electricity to the solenoid 34 is intercepted so that the sucking force of the sliding member 31 is reduced by the magnetism of the yoke 34a. At the same time, the compression coil spring 25 that elastically supports the supporting beam 23a of the handle 23 operates and the handle 23 is popped out as illustrated in FIG. 12 so that the memory cartridge B can be taken out by gripping the handle 23.

By doing so, the memory cartridge B taken out from the data recording device A set in an airplane can be carried as a single substance by accommodating the handle 23 in the main body 22. In addition, it is possible to download the data recorded in the memory cartridge B by the data recording device A provided in another place or an exclusively used recording and reproducing device, keep the downloaded data, and to reuse the memory cartridge B by erasing the record of the memory cartridge B.

As mentioned above, according to the inventions described in the claims of the present invention, since the memory cards loaded in the memory slot are elastically supported in the direction where the memory cards are loaded the moment the opening and closing door of the data recording device is closed, it is possible to prevent the memory cards from vibrating and from being detached from the multi-connectors.

What is claimed is:

1. A data recording device (A) comprising:
   a body portion (1);
   a memory cartridge holder (5);
   a memory cartridge (B) that is insertable and removable from the memory cartridge holder (5), the memory cartridge being structured and arranged to include:
     a main body portion (22) for accommodating a at least one first memory card (DM), and
     a memory slot (22d) that is disposed exterior to a main body portion (22) to enable inserting and removing a second memory card (CM) into the memory cartridge holder (5);
   an open-close door (2) that is rotatably attached to the body portion to provide access to the memory cartridge holder;
   a first pressing mechanism (10, 11) that is attached to the open-close door (2) for pressing the memory cartridge (B) in a cartridge loading direction; and a second pressing mechanism (14) that is attached to the open-close door (2), for supporting and pressing the second memory card (CM) in the cartridge loading direction.

2. The data recording device according to claim 1, wherein the second pressing mechanism comprises a seesaw lever which operates when the open-close door is closed.

3. The data recording device according to claim 2, wherein the seesaw lever is provided with a manipulation end being operated according to closing the open-close door and an operation end for pressing the second memory card in the loading direction according to the manipulation of the manipulation end.

4. The data recording device according to claim 1, wherein when the open-close door is closed, the second pressing mechanism operates and manipulation of a door knob is performed.

5. The data recording device according to claim 1, wherein the first memory card is a recording media for data and the second memory card is a recording media storing a system control program.

\* \* \* \* \*

UNITED STATES PATENT AND TRADEMARK OFFICE
CERTIFICATE OF CORRECTION

PATENT NO. : 7,367,035 B2
APPLICATION NO. : 10/830971
DATED : April 29, 2008
INVENTOR(S) : Yasuhide Kitaoka It is certified that error appears in the above-identified patent and that said Letters Patent is hereby corrected as shown below:

Column 4, line 4, "and: preventing" should read --and preventing--;

Column 4, lines 7-38, are duplicate paragraphs of Column 3, lines 42-67 and Column 4, lines 1-6, and should be deleted.

Signed and Sealed this

Eleventh Day of August, 2009

David J. Kappos
*Director of the United States Patent and Trademark Office*